United States Patent [19]
Lin et al.

[11] Patent Number: 5,717,201
[45] Date of Patent: Feb. 10, 1998

[54] DOUBLE FOUR-QUADRANT ANGLE-POSITION DETECTOR

[75] Inventors: Kang-Chen Lin, Taipei Hsien; Si-Chen Lee, Taipei, both of Taiwan

[73] Assignee: National Science Council, Taipei, Taiwan

[21] Appl. No.: 634,210

[22] Filed: Apr. 18, 1996

[51] Int. Cl.[6] .................................................. H01J 40/14
[52] U.S. Cl. ........................... 250/214 R; 250/208.1; 382/289
[58] Field of Search .......................... 250/214 R, 214.1, 250/208.1, 202; 382/289, 295, 199

[56] References Cited

U.S. PATENT DOCUMENTS

| | | | |
|---|---|---|---|
| 5,144,684 | 9/1992 | Inada et al. | 250/208.1 |
| 5,221,835 | 6/1993 | Setani | 250/208.1 |

*Primary Examiner*—Que Le
*Attorney, Agent, or Firm*—Cushman Darby & Cushman IP Group of Pillsbury Madison & Sutro LLP

[57] ABSTRACT

A double four-quadrant angle position detector is disclosed. The angle position detector comprises a first orientation detector, a second orientation detector, and a detecting means. The first orientation detector is composed of two pairs of photo-detecting means, arranged on opposite sides along vertical and horizontal directions, respectively, to generate output currents according to the brightness level. Similarly, the second orientation detector can also generate output currents according to brightness level. The detecting means determines a first angle and a second angle according to these output currents and then compares the difference of the first angle and the second angle with a preset threshold. When the difference is greater than the preset threshold, it indicates that an image angle is passing through the sensor.

20 Claims, 5 Drawing Sheets

DOUBLE FOUR-QUADRANT ANGLE-POSITION DETECTOR

BACKGROUND OF THE INVENTION

1. Field of the Invention

The present invention generally relates to an optical sensor. More particularly, the present invention relates to an angle position detector for detecting and extracting angle positions from a contrast image passing through it. The angle position detector uses solid-state devices for providing such a function.

2. Description of Related Art

The human visual system is quite complicated. Images of objects are produced by interaction among the human eyes, nerve cells, and the brain, which ultimately perceives the image. The first extracted feature in the visual capturing process is information concerning the position of a contrast image edge. Using this position information, the orientation of this contrast image edge can be readily determined "connecting" various positions of a contrast image edge. Further, the angle position at which two image edges cross also can be determined to identify the shape of an object. Therefore, information concerning the edge position, the edge orientation, and the angle position is fundamental to image recognition.

In a known image recognition system, a popular technique for extracting features from an image involves the use of computer software. Photo-detecting elements, such as charge coupled devices (CCDs), initially record the brightness level of an image, that is, each photo-detecting element serves as a pixel of the captured image. Next, software causes various algorithms to be carried out to determine image features by computations based on the brightness level of each pixel. Many such algorithms have been developed. However, this approach still suffers from a critical drawback. The routine computations of the brightness level of each pixel require so much time that recognition speed is severely degraded.

Recently, another recognition scheme to overcome the low-speed problem is to use a neural-like hardware detection circuit in place of the software such that the detected signals can be processed in parallel. Referring to "Analog VLSI and Neural System" by Carver Mead, a silicon retina, which is composed of more than 30 field-effect transistors and one phototransistor as a pixel unit, is disclosed and can simulate the response of the human retina. However, the silicon retina can merely acquire the edge position of an image. Thus, it replaces only one software procedure.

Another approach is disclosed in U.S. Pat. No. 5,351,309, the subject matter of which is hereby incorporated by reference as if fully set forth herein. The '309 patent discloses a four-quadrant orientation detector comprising four p-i-n diodes. This device can not only detect the position of an image edge but also the orientation of the image edge. However, the function of such a four-quadrant orientation detector, which lacks the capability of extracting the angle position, is still not complete in image recognition application. Data concerning the angle position is quite useful for some applications. For example, recognition for printed matter, writing, and special symbols requires angle position data to promote detection accuracy. In robot-controlling applications, the target angle positions can be determined accurately using the angle position detector and compare to the preset value, such that the feedback controlling time can be reduced and the production efficiency can be upgraded.

SUMMARY OF THE INVENTION

An object of the present invention is to provide an angle position detector for extracting the angle position information from an image. Preferably, the angle position detector can also be used for extracting the edge position and orientation at the same time. In addition, the angle position detector must have less complicated structure such that the fabrication cost can be reduced.

According to the foregoing object, the present invention provides an angle position detector, which comprises first and second orientation detectors and a detecting means.

The first orientation detector has a first pair of photo-detecting means for generating a first output current, and a second pair of photo-detection means for generating a second output current, respectively. Each of the photo-detecting means has a photosensitive electrode with the same dimensions. The two photo-detecting means in the same pair are connected back-to-back. The two photosensitive electrodes in the first pair of photo-detecting means are individually positioned on opposite sides of an inner square along a first direction. The two photosensitive electrodes in the second pair of photo-detecting means are individually positioned on opposite sides of the inner square along a second direction perpendicular to the first direction.

The second orientation detector has a third pair of photo-detecting means for generating a third output current, and a fourth pair of photo-detecting means for generating a fourth output current, respectively. Each of the photo-detecting means has a photosensitive electrode with the same dimensions which does not overlap with the photosensitive electrodes in the first orientation detector. The photo-detecting means in the same pair are connected back-to-back. The two photosensitive electrodes in the third pair of the photo-detecting means are individually positioned on opposite sides of an outer square along the first direction. The two photosensitive electrodes in the fourth pair of the photo-detecting means are individually positioned on opposite sides of the outer square along the second direction.

The detecting means is used for extracting the angle position from an image by means of the first output current, the second output current, the third output current, and the fourth output current. It comprises a processing means and a comparing means. The processing means performs an arctangent operation on the ratio of the first output current to the second output current, and generates a first angle. It also performs an arctangent operation on the ratio of the third output current to the fourth output current, and generates a second angle. The comparing means then compares a difference of the first angle and the second angle with a preset threshold to determine whether an image angle passes it or not.

BRIEF DESCRIPTION OF THE DRAWINGS

The detailed description of an embodiment of the present invention is made with reference to the accompanying drawings, wherein.

DETAILED DESCRIPTION OF THE PREFERRED EMBODIMENT

The technique for detecting the angle position of a contrast image in this embodiment is based on tricky arrangements of photosensitive electrodes in the photo-detecting elements, such as photodiodes. When an image angle passes through the angle position detector having such photosensitive electrodes, orientations of this image angle can be individually detected by inner and outer four-quadrant orientation detector, by comparing their difference with a preset threshold, the position of this image angle can be readily determined.

Figure 1:
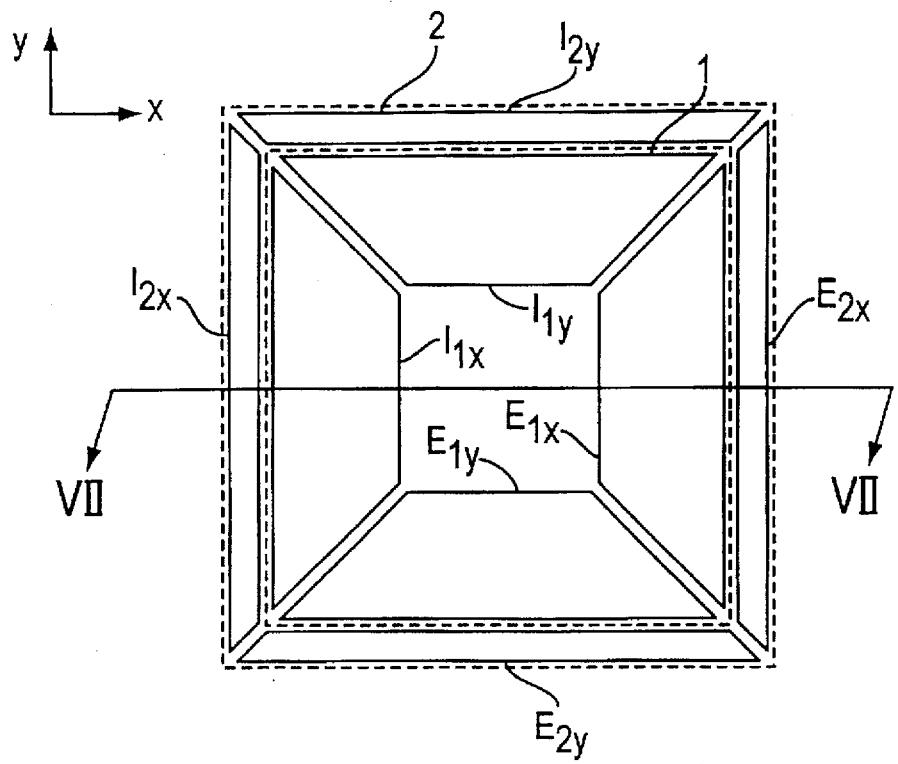
FIG. 1 is a top view of photosensitive electrodes in the double four-quadrant angle position detector according to the present invention; it comprises an inner ($E_{1x}$, $I_{1x}$, $E_{1y}$, $I_{1y}$) and outer ($E_{2x}$, $I_{2x}$, $E_{2y}$, $I_{2y}$) four-quadrant orientation detectors.

FIG. 1 is a top view of photosensitive electrodes in the double four-quadrant angle position detector according to the present invention. The arrangement of photosensitive electrodes will be described. The angle position detector in this embodiment comprises two orientation detectors. The first orientation detector comprises a first pair of photo-detecting means (such as p-i-n diodes) with photosensitive electrodes $E_{1x}$ and $I_{1x}$, and a second pair of photo-detecting means with photosensitive electrodes $E_{1y}$ and $I_{1y}$, respectively. Similarly, the second orientation detector comprises a third pair of photo-detecting means with photosensitive electrodes $E_{2x}$ and $I_{2x}$, and a fourth pair of photo-detecting means with photosensitive electrodes $E_{2y}$ and $I_{2y}$, respectively. Each of the photosensitive electrodes represents a corresponding photo-detecting element. Photosensitive electrodes $E_{1x}$, $I_{1x}$, $E_{1y}$, $I_{1y}$ have the same dimensions and are located on the periphery of square 1 (dash line), where electrodes $E_{1x}$ and $I_{1x}$ are positioned on the opposite sides of a first direction X (horizontal direction) and electrodes $E_{1y}$ and $I_{1y}$ are positioned on opposite sides of a second direction Y (vertical direction). In a like manner, photosensitive electrodes $E_{2x}$, $I_{2x}$, $E_{2y}$, $I_{2y}$ have the same dimensions and are located on the periphery of square 2 (dash line), where electrodes $E_{2x}$ and $I_{2x}$ are positioned on the opposite sides of the first direction X and electrodes $E_{2y}$ and $I_{2y}$ are positioned on the opposite sides of the second direction Y. In this embodiment, a bare region within the center of square 1 and square 2 is reserved for implementing auxiliary electronic devices. All of the photosensitive electrodes are trapezoids having space between one another.

Figure 2:
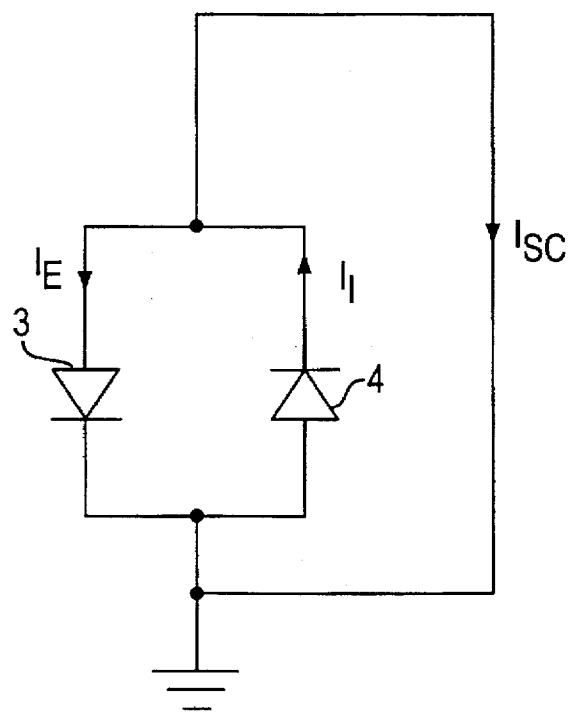
FIG. 2 is a circuit diagram of a pair of photo-detecting means (photodiodes) according to the present invention.

FIG. 2 shows a circuit diagram of a pair of photo-detecting elements. The pair of photodetecting means includes an excitatory diode 3 and an inhibitory diode 4 connected back-to-back (anode of the excitatory diode 3 and an cathode of the inhibitory diode 4 are connected, and a cathode of the excitatory diode 3 and an anode of the inhibitory diode 4 are connected, in this case to ground). Photocurrents $I_E$ and $I_I$ produced in the excitatory diode 3 and the inhibitory diode 4 are combined into an output current $I_{SC}$.

Figure 3:
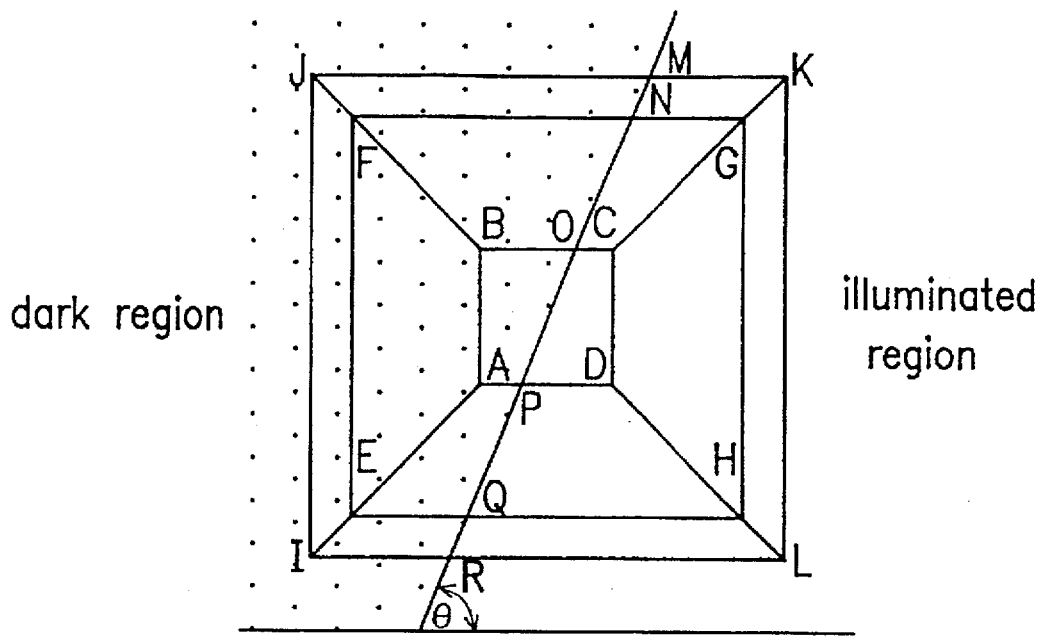
FIG. 3 is a top view of an idealized (without spacing) configuration of photosensitive electrodes in the double four-quadrant angle position detector through which a half-plane edge passes.

Before discussing the entire angle position detector, the principle of detecting an image edge or an image angle will be described as follows in some detail. FIG. 3, which is a top view of an idealized (without spacing) configuration of photosensitive electrodes in the double four-quadrant angle position detector through which a half-plane edge passes. The orientation of the edge MNOPQR can be represented as an oblique angle $\theta$. The four photosensitive electrodes in the first orientation detector are denoted as trapezoids ABFE, BCGF, CDHG, DAEH, and those in the second orientation detector are denoted as trapezoids EFJI, FGKJ, GHLK, HEIL. The edge MNOPQR will separate these photosensitive electrodes into two regions: one illuminated and one dark. According to geometrical analysis, the relationship between the oblique angle $\theta$ and dimensions of the illuminated region is represented as follows:

$$\tan\theta = \frac{A_{CDHG}}{A_{PDHQ} - A_{CONG}} = \frac{A_{HGKL}}{A_{QHLR} - A_{MKGN}} \quad (1)$$

wherein $A_{(.)}$ represent the areas of the corresponding trapezoids.

The photocurrent produced by each of the photo-detecting means is proportional to the area of the illuminated region. Therefore, the output current $I_1$ of the first pair of photo-detecting means (with photosensitive electrodes $E_{1x}$ and $I_{1x}$) will be proportional to the area $A_{CDHG}$. The output current $I_2$ of the second pair of photo-detecting means (with photosensitive electrodes $E_{1y}$ and $I_{1y}$) will be proportional to the difference of the area $A_{PDHQ}$ and the area $A_{CONG}$, due to the back-to-back connection. Also, the output current $I_3$ of the third pair of photo-detecting means (with photosensitive electrodes $E_{2x}$ and $I_{2x}$) will be proportional to the area $A_{HGKL}$, and the output current $I_4$ of the fourth pair of photo-detecting means (with photosensitive electrodes $E_{2y}$ and $I_{2y}$) will be proportional to the difference of the area $A_{QHLR}$ and the area $A_{MKGN}$. Equation (2) can be derived as $$\tan\theta = \frac{I_1}{I_2} = \frac{I_3}{I_4} \quad (2)$$

However, in terms of a practical implementation, there must be some space between the photosensitive electrodes which are necessary for interconnection.

Figure 4:
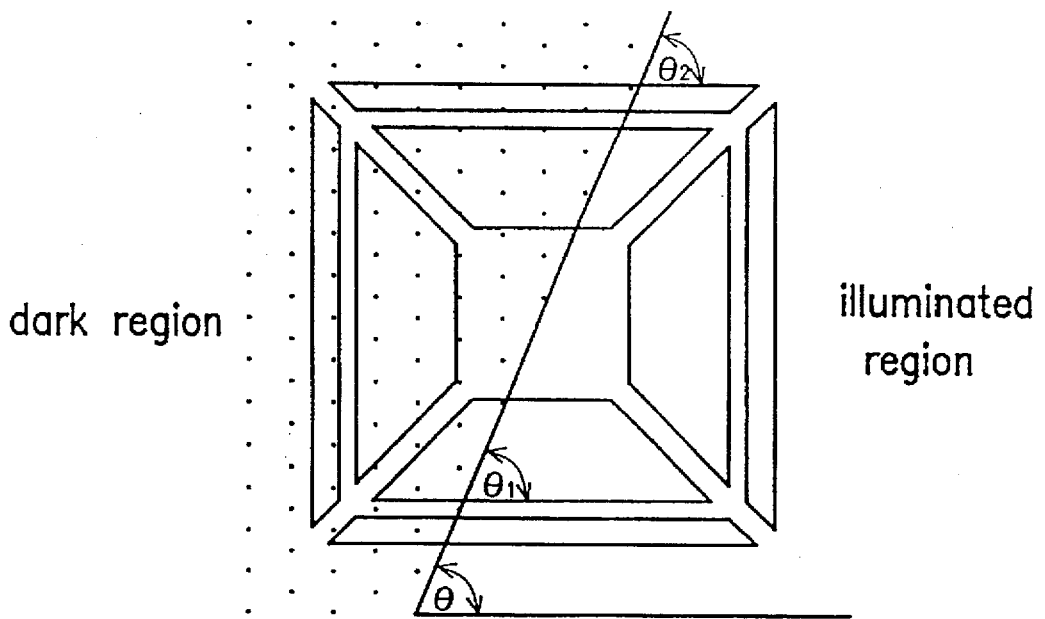
FIG. 4 is a top view of a practical (with spacing) configuration of photosensitive electrodes in the double four-quadrant angle position detector through which a half-plane edge passes.

FIG. 4 is a top view of a practical (with spacing) configuration of photosensitive electrodes in the double four-quadrant angle position detector through which a half-plane edge passes. An oblique angle $\theta_1$ can be determined by output currents $I_1$, $I_2$ of the first orientation detector (the inner) and an oblique angle $\theta_2$ can also be determined by output currents $I_3$, $I_4$ of the second orientation detection (the outer one). Because of the spacing between these photosensitive electrodes, a portion of light can not be normally detected and different errors may affect the accuracy of the oblique angles $\theta_1$ and $\theta_2$. The larger the spacing is, the more such errors are produced. In a specified condition, the maximum error can be represented as a threshold value $\theta_T$ for discriminating between cases of an image edge passing through or an image angle passing through the sensor.

Figure 5:
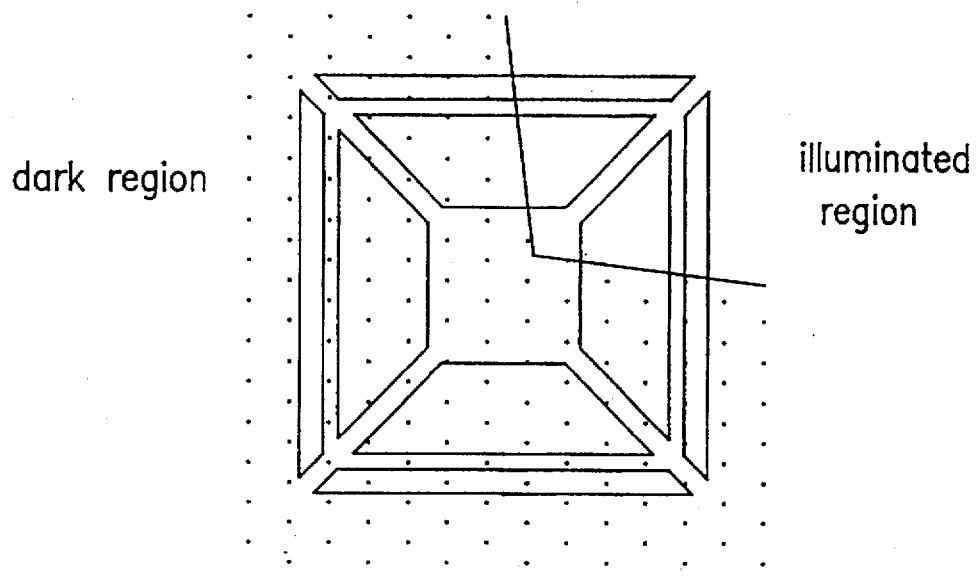
FIG. 5 is a top view of a practical (with spacing) configuration of photosensitive electrodes in the double four-quadrant angle position detector through which an angle of a contrast image edge passes.

FIG. 5 is a top view of a practical (with spacing) configuration of photosensitive electrodes in the double four-quadrant angle position detector through which an angle of a contrast image edge passes. Oblique angles $\theta_1$ and $\theta_2$ determined in such a condition lack the original geometrical meaning, and therefore $\theta_1 \neq \theta_2$. Considering FIG. 3 and FIG. 5, when $\theta_1 = \theta_2$, it means that an image edge is passing; when $\theta_1 \neq \theta_2$, it means that an image angle is passing. However, considering the practical cases shown in FIG. 4 and FIG. 5, when $\theta_1 - \theta_2 \leq \theta_T$, it means that an image edge is passing; when $\theta_1 - \theta_2 > \theta_T$, it means that an image corner is passing. Therefore, the threshold angle $\theta_T$ can be treated as a criteria of what kind of images are passing through this sensor.

Figure 6:
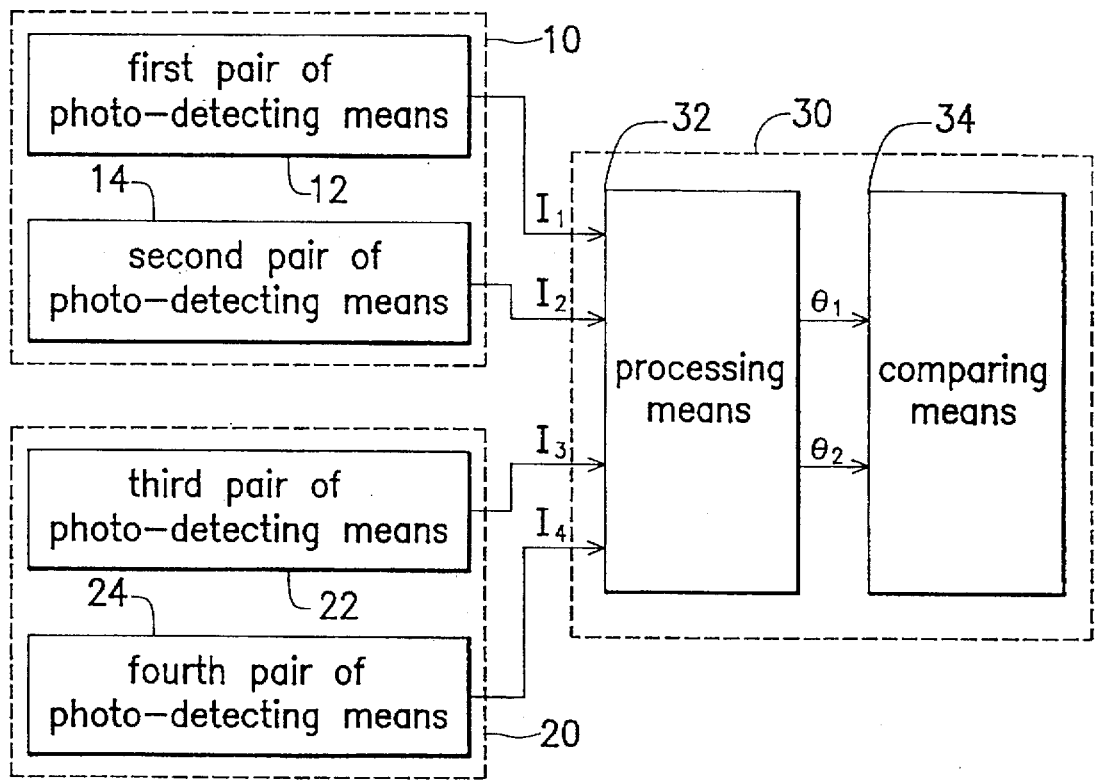
FIG. 6 is a block diagram of the double four-quadrant angle-position detector according to the present invention.

FIG. 6 is a block diagram of the double four-quadrant angle position detector according to the present invention. First orientation detector 10 comprises first pair 12 of the photo-detecting means and second pair 14 of the photo-detecting means, which produce output currents $I_1$ and $I_2$, respectively. Similarly, second orientation detector 20 comprises third pair 22 of the photo-detecting means and second pair 24 of the photo-detecting means, which produce output currents $I_3$ and $I_4$, respectively. Detecting means 30 is used for determining whether an image edge or angle passes by means of output currents $I_1, I_2, I_3, I_4$. First, processing means 32 calculates the arctangent value of the ratio of the output currents $I_1$ and $I_2$, $\tan^{-1}(I_1/I_2)$, and the ratio of the output currents $I_3$ and $I_4$, $\tan^{-1}(I_3/I_4)$. The two resultant values are the abovementioned $\theta_1$ and $\theta_2$ according to Equation (2). Comparing means 34 calculates the difference $\theta_1 - \theta_2$ and then compares it with a preset threshold $\theta_T$, which represents the maximum error of the oblique angles $\theta_1$ and $\theta_2$ while an image edge passes through the sensor. When $\theta_1 - \theta_2 \leq \theta_T$, it means that an image edge is passing; when $\theta_1 - \theta_1 > \theta_T$, it means that an image corner is passing.

Figure 7:
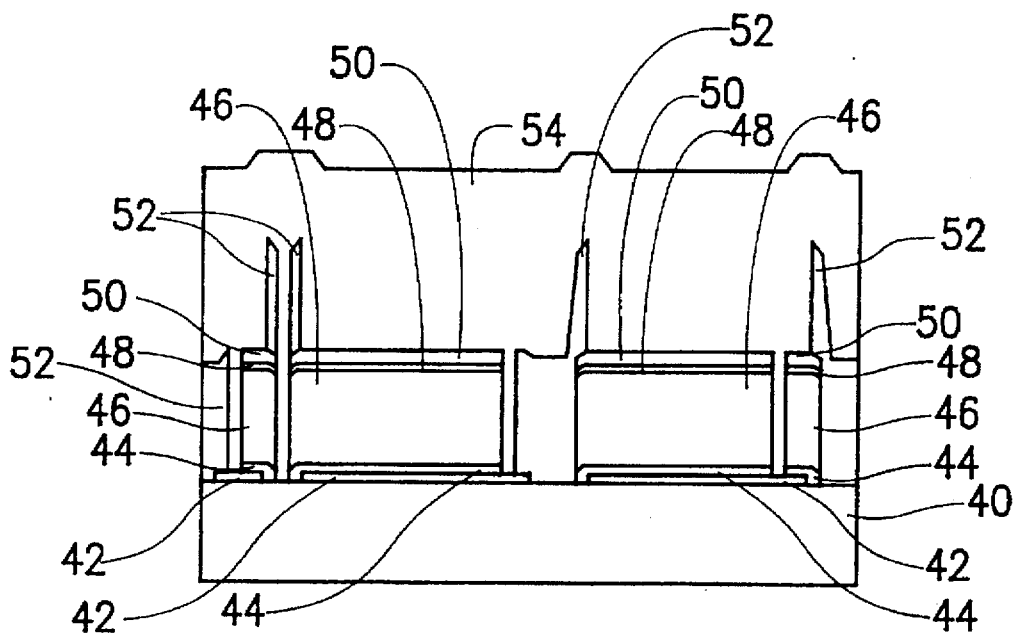
FIG. 7 is a sectional side view along the line VII—VII in FIG. 1.

The method of preparing the double four-quadrant angle position detector is stated as follows. P-i-n diodes, which serve as photo-detecting means in this embodiment, are depicted as FIG. 7. FIG. 7 is a sectional side view along the line VII—VII in FIG. 1. Insulating substrate 40, made of glass or plastic, is used for supporting the structure of pin diodes. In this embodiment, a 7059 glass substrate is adopted. A bottom metal layer 42, about 100 nm thick, for example, chromium, is thermally evaporated onto the glass substrate 40 for the bottom interconnection of pin diodes and external circuitry. After patterning the bottom metal layer 42, a 30 mm n-type hydrogenated amorphous silicon layer (a-Si:H) 44, a 500 nm intrinsic layer 46, a 18 nm p-type hydrogenated amorphous silicon layer 48 are successively deposited in a single run, using PECVD and in the substrate temperature of 250° C., to form the required pin diode structure. Then a 150 nm indium tin oxide (ITO) layer 50, serving as transparent conductor, is deposited onto the p-type a-Si:H layer 48. Indium tin oxide layer 50 and pin diode layers 44,46 48 are patterned to form the required shape of photosensitive electrodes. A 200 nm top metal layer 52, for example, aluminum, can be thermally evaporated onto the resultant structure and patterned for top interconnection. Finally, a 1.2 µm a-SiN$_x$:H layer 54 can cover such a structure, as depicted in FIG. 7.

In addition, processing means 32 performs two division operations for calculating the ratio of $I_1/I_2$ and $I_3/I_4$, and two arctangent operations for calculating the measured angle $\theta_1$ and $\theta_2$. Implementation of division and arctangent operations can be easily obtained by well-known, commercial analog ICs. Similarly, comparing means 34 performs one subtraction operation and one comparison operation, which also can be easily embodied by commercially available analog ICs.

Figure 8:
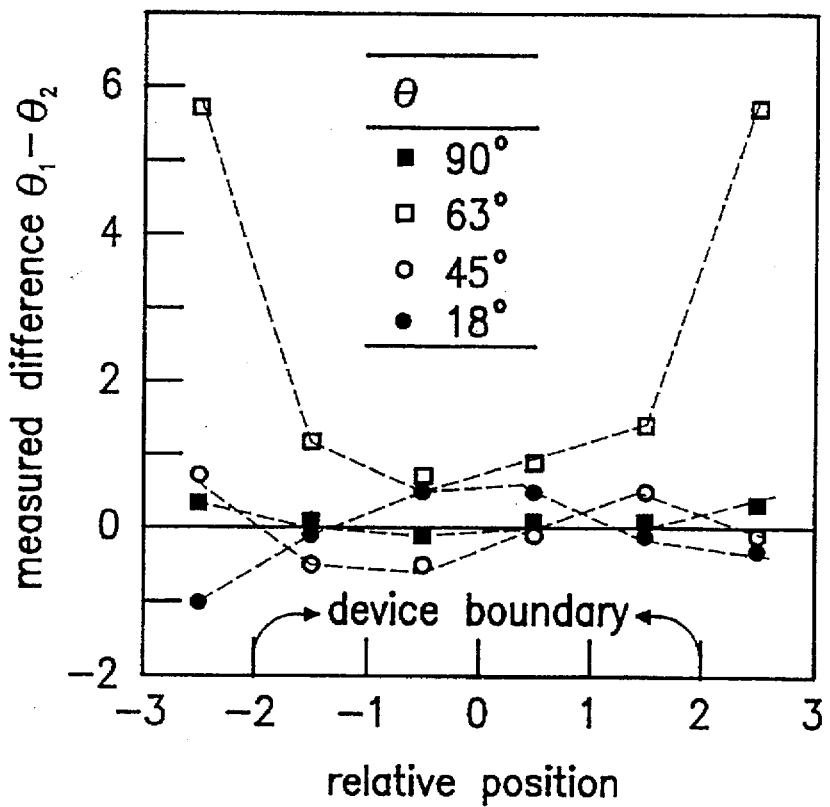
FIG. 8 is a graph showing the measured difference between the angles $\theta_1$ and $\theta_2$ wherein various image edges with distinct inclined angles pass through the specific regions of the photosensitive electrodes as shown in FIG. 4.

The threshold angle $\theta_T$ for discriminating whether an image angle passes can be determined by the following steps in this embodiment. A test set of image edges with oblique angles 18°, 45°, 63°, 90°, respectively, pass through the relative positions of the photosensitive electrodes shown in FIG. 1. The measured differences $\theta_1 - \theta_2$ in these specific positions for various testing image edges are shown in FIG. 8. In this case, the maximum difference $\theta_1 - \theta_2$ is 6° under the condition of oblique angle being 63° and around the corner position. Then all other measured differences $\theta_1 - \theta_2$ can be limited within the range of 1°. The measured angle difference will vary with respect to size of spacing and devices. Now the preset threshold $\theta_T$ can be assigned as 6° for the following test.

Figure 9:
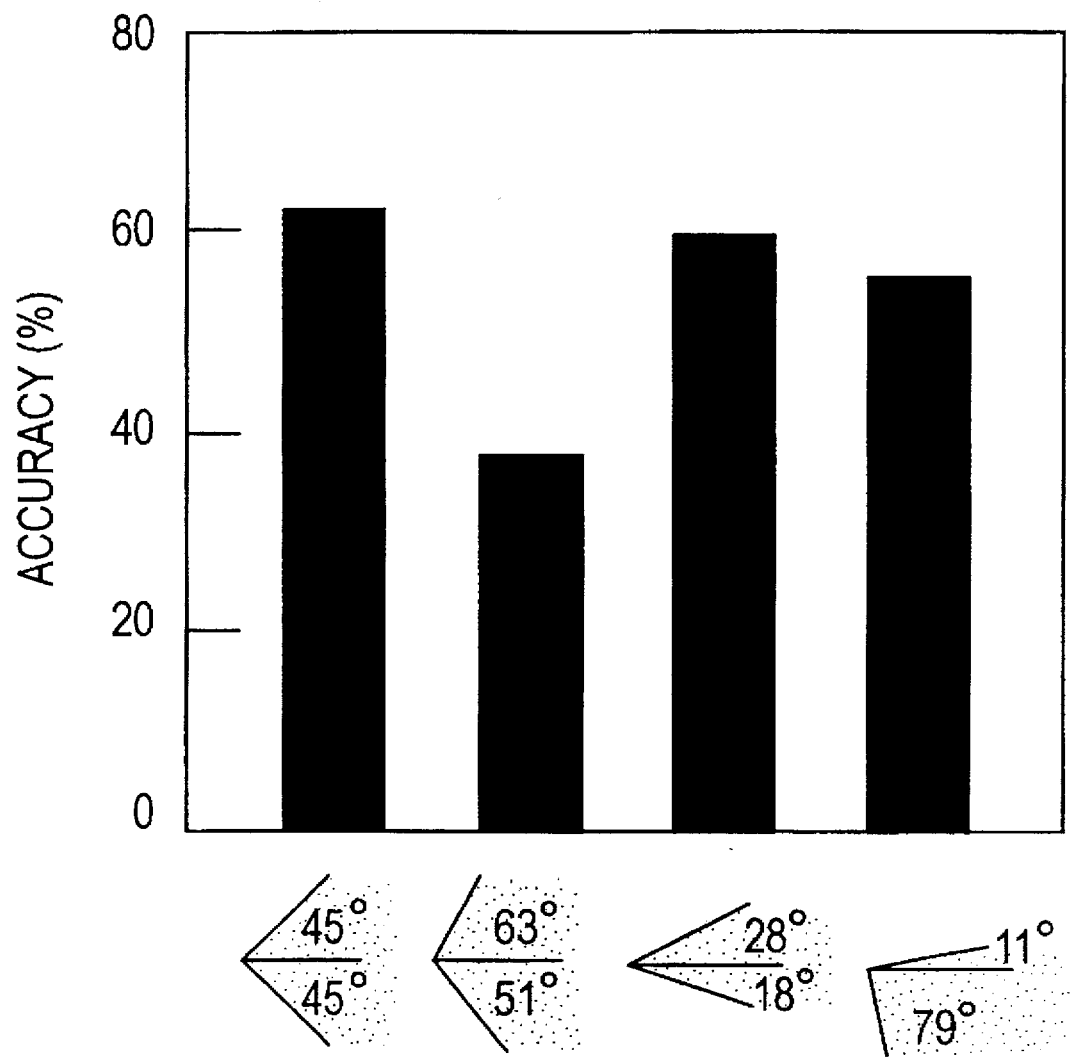
FIG. 9 is a graph showing the detection accuracy of the double four-quadrant angle position detector wherein four types of image angles pass through the testing zones.

The performance of the angle position detector can be evaluated by the following scheme. The region of the photosensitive electrodes can be equally divided into 4×4 testing zones, that is, 16 testing zones. Various types of images angles for testing then can be applied to the center of all of the testing zones to acquire average detecting accuracy. FIG. 9 is a graph showing the detection accuracy of the double four-quadrant angle position detector under the condition that four selected types of image angles pass through the testing zones. According to FIG. 9, the average accuracy of the testing patterns is about 55%. In the practical condition, the angle position detector in this embodiment often serves as a pixel, a building block for a picture detector. Therefore, the neighboring angle position detectors can cooperate to enhance the detection accuracy, and only a very simple software program performing correction operation is required.

The advantages of the double four-quadrant angle position detector in the present invention are described as follows:

1. The angle position detector is principally comprised of an inner orientation detector and an outer orientation detector. Therefore, the device disclosed in the above embodiment can not only extract the information of the angle position, but also extract the information of the edge position and the edge orientation.

2. The method of fabricating the angle position detector is quite simple. The required equipment, such as cleaning tanks, the plasma-enhanced chemical vapor deposition system, and metal-sputtering equipment, all are prevalent in the average laboratory.

3. Because the angle position detector only uses four p-i-n diodes as sensors and the substrate can be glass or plastic, the fabrication cost is quite low.

The foregoing description of preferred embodiments of the present invention has been provided for the purposes of illustration and description. It is not intended to be exhaustive or to limit the invention to the precise forms disclosed. Many modifications and variations will be apparent to practitioners skilled in this art. The embodiments were chosen and described to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. An angle position detector, comprising:
    a first orientation detector, having a first pair of photo-detecting means and a second pair of photo-detection means for generating a first output current and a second output current, respectively, wherein each of the photo-detecting means has a photosensitive electrode with the same dimensions, the photo-detecting means in the same pair are connected back-to-back, and the photosensitive electrodes in the first pair of photo-detecting means are individually positioned on opposite sides of an inner square along a first direction and the photosensitive electrodes in the second pair of photo-detecting means are individually positioned on opposite sides of the inner square along a second direction perpendicular to the first direction;

a second orientation detector, having a third pair of photo-detecting means and a fourth pair of photo-detecting means for generating a third output current and a fourth output current, respectively, wherein each of the photo-detecting means has a photosensitive electrode with the same dimensions which does not overlap with the photosensitive electrodes in the first orientation detector, the photo-detecting means in the same pair are connected back-to-back, the photosensitive electrodes in the third pair of the photo-detecting means are individually positioned on opposite sides of an outer square along the first direction, and the photosensitive electrodes in the fourth pair of the photo-detecting means are individually positioned on opposite sides of the outer square along the second direction; and a means for detecting the angle position of an image by means of the first output current, the second output current, the third output current, and the fourth output current.

2. The angle position detector of claim 1, wherein the photosensitive electrodes in the first orientation detector and in the second orientation detector are trapezoids with space therebetween.

3. The angle position detector of claim 1, wherein the detecting means comprises:

a means for processing an arctangent operation on the ratio of the first output current to the second output current and generating a first angle, and for processing an arctangent operation on the ratio of the third output current to the fourth output current and generating a second angle; and a means for comparing a difference of the first angle and the second angle with a preset threshold to determine whether an image angle passes it or not.

4. The angle position detector of claim 3, wherein the photosensitive electrodes in the first orientation detector and in the second orientation detector are trapezoids with space therebetween.

5. The angle position detector of claim 3, wherein the preset threshold is determined by the dimensions of the photosensitive electrodes and spacing between them.

6. The angle position detector of claim 3, wherein each of the pairs of the photo-detecting means comprises:

an excitatory diode with a grounding cathode; and an inhibitory diode with a grounding anode, wherein an anode of the excitatory diode and a cathode of the inhibitory diode are connected to produce the corresponding output current.

7. The angle position detector of claim 6, wherein the photosensitive electrodes in the first orientation detector and in the second orientation detector are trapezoids having space therebetween.

8. The angle position detector of claim 6, wherein the preset threshold is determined by the dimensions of the photosensitive electrodes and spacing between them.

9. The angle position detector of claim 6, wherein the excitatory diode together with the inhibitory diode are manufactured on an insulating substrate, and comprise:

a bottom metal layer located on the insulating substrate for interconnection;

an n-type hydrogenated amorphous silicon layer located on the bottom metal layer;

an intrinsic layer located on the n-type hydrogenated amorphous silicon layer;

a p-type hydrogenated amorphous silicon layer located on the intrinsic layer;

a transparent conductor located on the p-type hydrogenated amorphous silicon layer; and a top metal layer located on the transparent conductor for interconnection.

10. The angle position detector of claim 9, wherein the bottom metal layer is made of chromium.

11. The angle position detector of claim 9, wherein the transparent conductor is made of indium tin oxide.

12. The angle position detector of claim 9, wherein the top metal layer is made of aluminum.

13. The angle position detector of claim 9, wherein the insulating substrate is made of a material selected from the group consisting of glass and plastic.

14. The angle position detector of claim 1, wherein each of the pairs of the photo-detecting means comprises:

an excitatory diode with a grounding cathode; and an inhibitory diode with a grounding anode, wherein an anode of the excitatory diode and a cathode of the inhibitory diode are connected to produce the corresponding output current.

15. The angle position detector of claim 14, wherein the photosensitive electrodes in the first orientation detector and in the second orientation detector are trapezoids with space therebetween.

16. The angle position detector of claim 14, wherein the excitatory diode together with the inhibitory diode are manufactured on an insulating substrate and comprise:

a bottom metal layer located on the insulating substrate for interconnection;

an n-type hydrogenated amorphous silicon layer located on the bottom metal layer;

an intrinsic layer located on the n-type hydrogenated amorphous silicon layer;

a p-type hydrogenated amorphous silicon layer located on the intrinsic layer;

a transparent conductor located on the p-type hydrogenated amorphous silicon layer; and a top metal layer located on the transparent conductor for interconnection.

17. The angle position detector of claim 16, wherein the bottom metal layer is made of chromium.

18. The angle position detector of claim 16, wherein the transparent conductor is made of indium tin oxide.

19. The angle position detector of claim 16, wherein the top metal layer is made of aluminum.

20. The angle position detector of claim 16, wherein the insulating substrate is made of a material selected from the group consisting of glass and plastic.

* * * * *